United States Patent
Partsch et al.

(10) Patent No.: US 6,952,378 B2
(45) Date of Patent: Oct. 4, 2005

(54) METHOD FOR ON-DIE DETECTION OF THE SYSTEM OPERATION FREQUENCY IN A DRAM TO ADJUST DRAM OPERATIONS

(75) Inventors: Torsten Partsch, Chapel Hill, NC (US); Jennifer Huckaby, Raleigh, NC (US); Johnathan T. Edmonds, Cary, NC (US); Tao Tian, Raleigh, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/042,624

(22) Filed: Jan. 25, 2005

(65) Prior Publication Data

US 2005/0122832 A1 Jun. 9, 2005

Related U.S. Application Data (62) Division of application No. 10/260,919, filed on Sep. 30, 2002.

(51) Int. Cl.[7] .................................................. G11C 8/18
(52) U.S. Cl. ...................... 365/233; 365/194; 365/191; 365/210; 365/189.07; 365/236
(58) Field of Search .............................. 365/233, 194, 365/191, 210, 208, 189.07, 236.63

(56) References Cited

U.S. PATENT DOCUMENTS

| | | | | |
|---|---|---|---|---|
| 5,883,853 | A | 3/1999 | Zheng et al. | 365/233 |
| 6,259,652 | B1 | 7/2001 | Heyne et al. | 365/189.01 |
| 6,272,035 | B1 | 8/2001 | Dietrich et al. | 365/63 |
| 6,275,445 | B1 | 8/2001 | Dietrich et al. | 365/233 |
| 6,285,176 | B1 | 9/2001 | Marx et al. | 323/313 |
| 6,285,228 | B1 | 9/2001 | Heyne et al. | 327/246 |
| 6,351,167 | B1 | 2/2002 | Hein et al. | 327/158 |
| 6,366,527 | B2 | 4/2002 | Hein et al. | 365/233 |
| 6,388,944 | B2 | 5/2002 | Schrogmeier et al. | 365/233 |
| 6,480,024 | B2 | 11/2002 | Dietrich et al. | 326/38 |
| 6,628,566 | B2 | 9/2003 | Jeong | 365/230.06 |
| 6,661,728 | B2 | 12/2003 | Tomita et al. | 365/226 |
| 6,711,091 | B1 | 3/2004 | Partsch et al. | 365/233 |
| 6,809,914 | B2 | 10/2004 | Edmonds et al. | 361/93.8 |
| 6,809,978 | B2 | 10/2004 | Alexander et al. | 365/211 |
| 2001/0033523 | A1 | 10/2001 | Hein et al. | 365/233 |
| 2001/0038566 | A1 | 11/2001 | Schrogmeier et al. | 365/223 |
| 2002/0075707 | A1 | 6/2002 | Dietrich et al. | 363/60 |
| 2002/0079925 | A1 | 6/2002 | Dietrich et al. | 326/83 |
| 2002/0089319 | A1 | 7/2002 | Heyne et al. | 323/313 |
| 2002/0093855 | A1 | 7/2002 | Heyne et al. | 365/194 |
| 2002/0133750 | A1 | 9/2002 | Dietrich et al. | 714/30 |
| 2002/0141279 | A1 | 10/2002 | Dietrich et al. | 365/233 |
| 2003/0001636 | A1 | 1/2003 | Partsch et al. | 327/158 |
| 2003/0012322 | A1 | 1/2003 | Partsch et al. | 375/376 |
| 2003/0210505 | A1 | 11/2003 | Partsch et al. | 361/103 |
| 2004/0062138 | A1 | 4/2004 | Partsch et al. | 365/233 |

*Primary Examiner*—Andrew Q. Tran
(74) *Attorney, Agent, or Firm*—Brinks Hofer Gilson & Lione (57) ABSTRACT

The present invention relates to a method of operating a memory system comprising a memory chip. An operating signal is generated at an operating frequency. The operating frequency is applied to the memory chip to control one or more electrical components of the memory system. A reference signal is generated at a reference frequency within the memory chip and a range of values for the operating frequency is detected based on the reference signal and the operating signal.

16 Claims, 6 Drawing Sheets

METHOD FOR ON-DIE DETECTION OF THE SYSTEM OPERATION FREQUENCY IN A DRAM TO ADJUST DRAM OPERATIONS

RELATED APPLICATIONS

The present patent document is a divisional application of U.S. patent application Ser. No. 10/260,919 filed Sep. 30, 2002, which is hereby incorporated herein in its entirety by this reference.

BACKGROUND

1. Field of the Invention

The present invention relates to the field of memory chips.

2. Discussion of Related Art

Figures 1, 2:
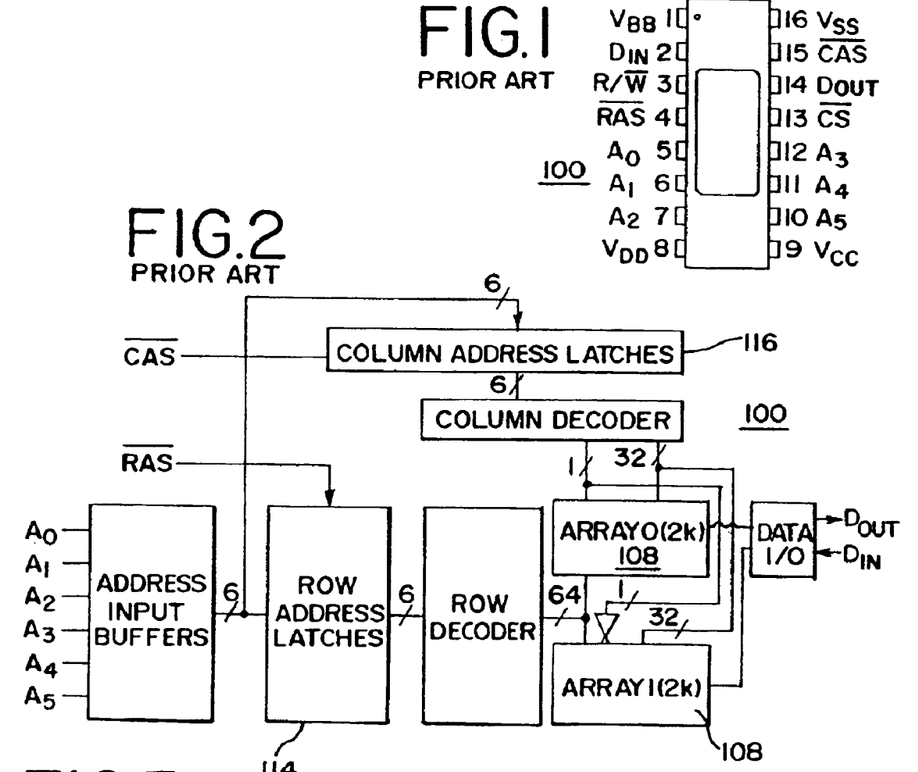
FIG. 1 schematically shows a top view of an embodiment of a known memory chip.
FIG. 2 shows a block diagram of the memory chip of FIG. 1.
Figure 3:
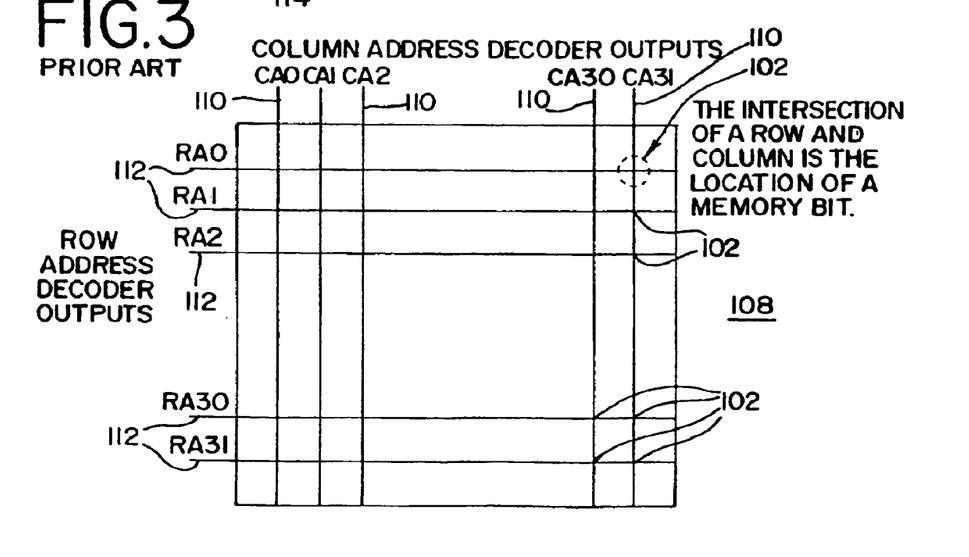
FIG. 3 schematically shows an embodiment of a memory array to be used with the memory chip of FIG. 1.
Figure 4:
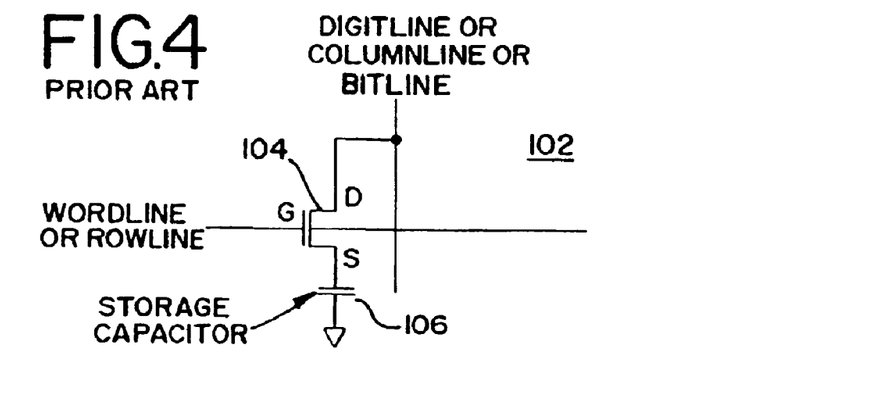
FIG. 4 schematically shows an embodiment of a memory cell to be used with the memory array of FIG. 3.

A known integrated memory IC 100 that is a writeable memory of the DRAM type is shown in FIG. 1. Such a dynamic random access memory (DRAM) chip 100 includes a plurality of memory storage cells 102 in which each cell 102 has a transistor 104 and an intrinsic capacitor 106. As shown in FIGS. 2 and 3, the memory storage cells 102 are arranged in arrays 108, wherein memory storage cells 102 in each array 108 are interconnected to one another via columns of conductors 110 and rows of conductors 112. The transistors 104 are used to charge and discharge the capacitors 106 to certain voltage levels. The capacitors 106 then store the voltages as binary bits, 1 or 0, representative of the voltage levels. The binary 1 is referred to as a "high" and the binary 0 is referred to as a "low." The voltage value of the information stored in the capacitor 106 of a memory storage cell 102 is called the logic state of the memory storage cell 102.

As shown in FIGS. 1 and 2, the memory chip 100 includes six address input contact pins A0, A1, A2, A3, A4, A5 along its edges that are used for both the row and column addresses of the memory storage cells 102. The row address strobe (RAS) input pin receives a signal RAS that clocks the address present on the DRAM address pins A0 to A5 into the row address latches 114. Similarly, a column address strobe (CAS) input pin receives a signal CAS that clocks the address present on the DRAM address pins A0 to A5 into the column address latches 116. The memory chip 100 has data pin Din that receives data and data pin Dout that sends data out of the memory chip 100. The modes of operation of the memory chip 100, such as Read, Write and Refresh, are well known and so there is no need to discuss them for the purpose of describing the present invention.

Figure 5:
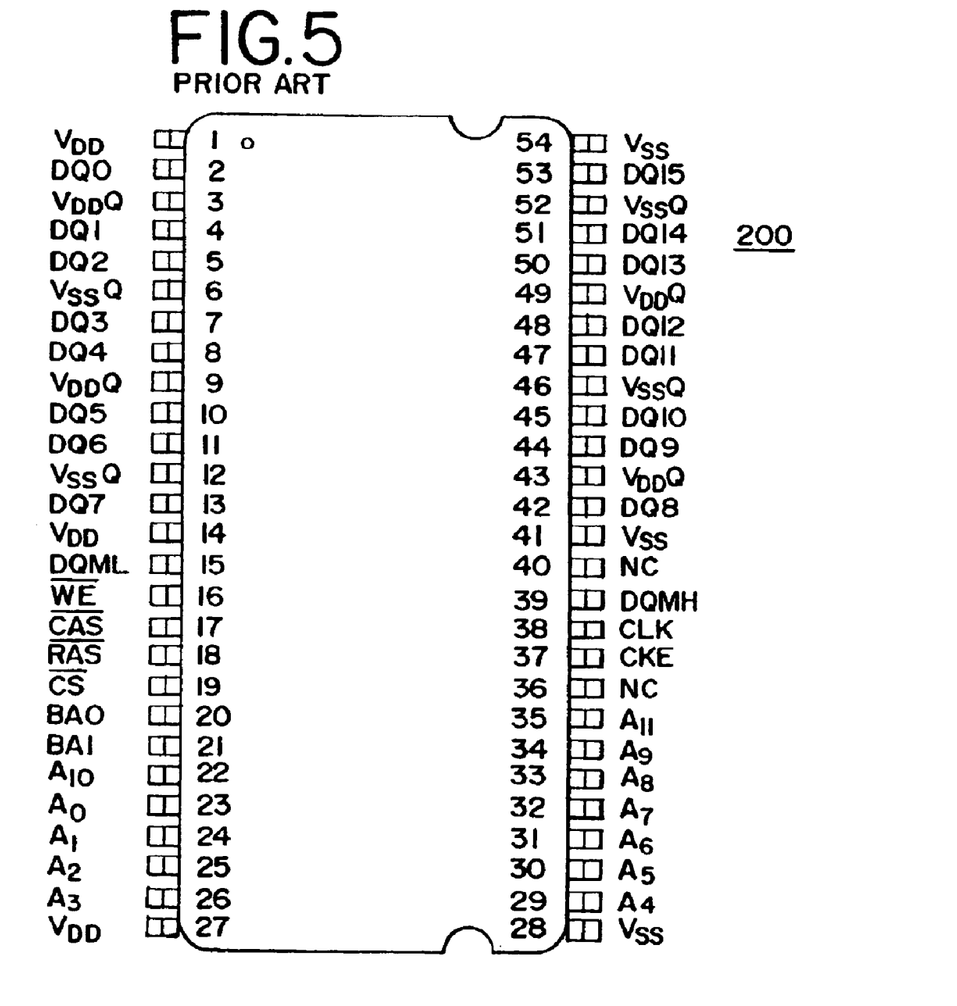
FIG. 5 schematically shows a top view of a second embodiment of a known memory chip.
Figure 6:
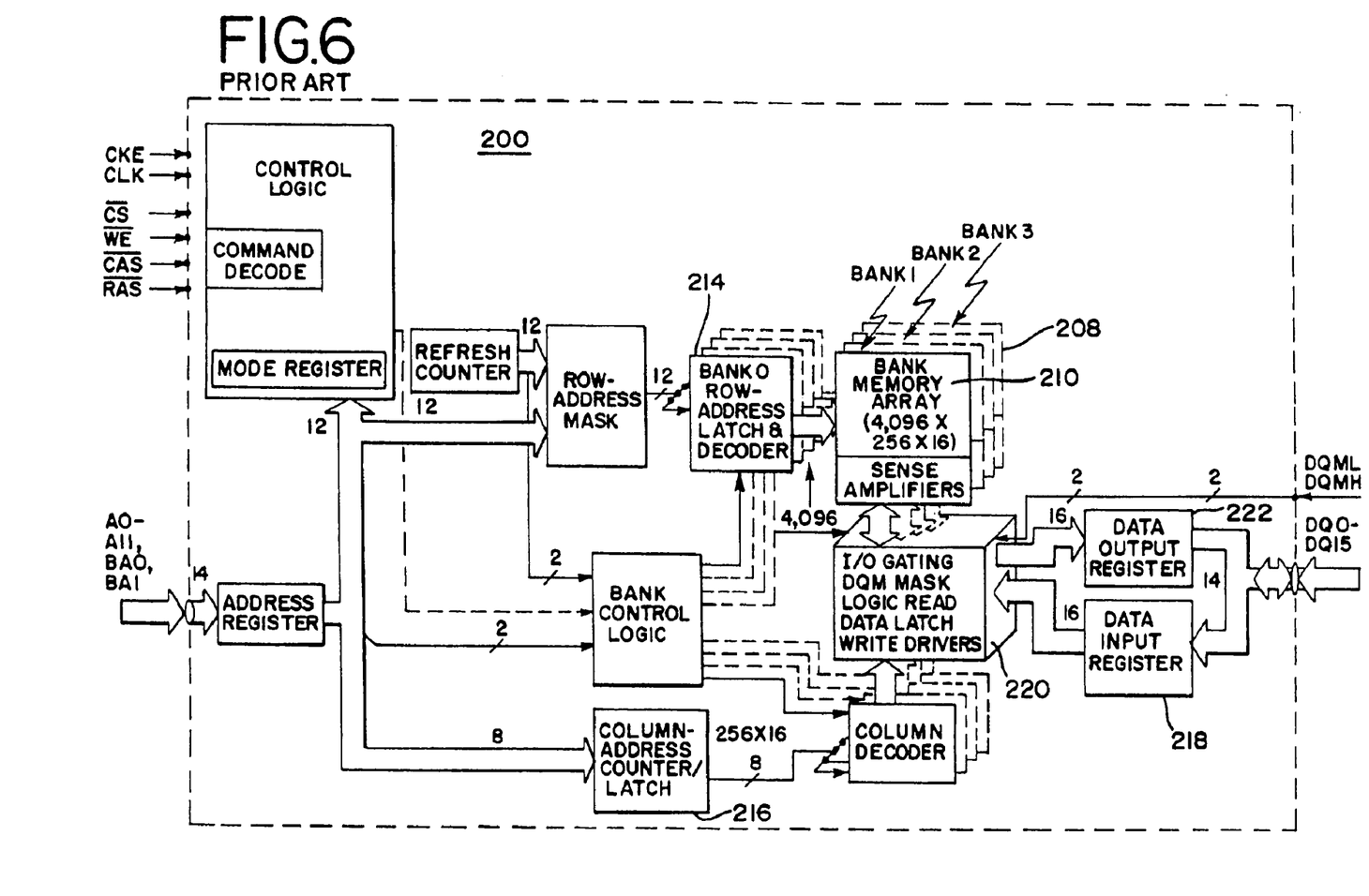
FIG. 6 shows a block diagram of the memory chip of FIG. 5.

A variation of a DRAM chip is shown in FIGS. 5 and 6. In particular, by adding a synchronous interface between the basic core DRAM operation/circuitry of a second generation DRAM and the control coming from off-chip a synchronous dynamic random access memory (SDRAM) chip 200 is formed. The SDRAM chip 200 includes a bank of memory arrays 208 wherein each array 208 includes memory storage cells 210 interconnected to one another via columns and rows of conductors.

As shown in FIGS. 5 and 6, the memory chip 200 includes twelve address input contact pins A0–A11 that are used for both the row and column addresses of the memory storage cells of the bank of memory arrays 208. The row address strobe (RAS) input pin receives a signal RAS that clocks the address present on the DRAM address pins A0 to A11 into the bank of row address latches 214. Similarly, a column address strobe (CAS) input pin receives a signal CAS that clocks the address present on the DRAM address pins A0 to A11 into the bank of column address latches 216. The memory chip 200 has data input/output pins DQ0–15 that receive and send input signals and output signals. The input signals are relayed from the pins DQ0–15 to a data input register 218 and then to a DQM processing component 220 that includes DQM mask logic and write drivers for storing the input data in the bank of memory arrays 208. The output signals are received from a data output register 222 that received the signals from the DQM processing component 220 that includes read data latches for reading the output data out of the bank of memory arrays 208. The modes of operation of the memory chip 200, such as Read, Write and Refresh, are well known and so there is no need to discuss them for the purpose of describing the present invention.

A variation of the SDRAM chip 200 is a double-data-rate SDRAM (DDR SDRAM) chip. The DDR SDRAM chip 300 imparts register commands and operations on the rising edge of the clock signal while allowing data to be transferred on both the rising and falling edges of the clock signal. Differential input clock signals CLK and CLK(bar) are used in the DDR SDRAM. A major benefit of using a DDR SDRAM is that the data transfer rate can be twice the clock frequency because data can be transferred on both the rising and falling edges of the CLK clock input signal.

It is noted that new generations of memory systems that employ SDRAM and DDR SDRAM chips are increasing their frequency range. Currently, SDRAM and DDR SDRAM chips are unable to determine the frequency at which they are operating in a particular memory system. As the frequency range of the memory system widens, it can pose some problems for the SDRAM and DDR SDRAM chips. For example, a DDR SDRAM chip has to time operations between different clocking domains. It is known that the clocking domains change their relative timing to one another as a function of the operating frequency of the memory system. This change in relative timing is illustrated in FIGS. 7 and 8.

In the case of a slow operating frequency, such as e.g 66 MHz, the system clock signal VCLK is directed to the clock pin of the DDR SDRAM. The system clock signal VCLK generates within the DDR SDRAM an internal clock signal ICLK that clocks the central command unit of the DDR SDRAM. This means that all internal commands generated by the central command unit are synchronized with the internal clock signal ICLK. As shown in FIG. 7, while the internal clock signal ICLK has the same frequency as the system clock signal VCLK, it lags the system clock signal VCLK by a constant amount tMAR2. The lag is caused by several gate and propagation delays. This lag results in a phase shift between ICLK and VCLK that grows in magnitude as the frequency of the clock signals is raised. This phase shift increase is a result of the relation of the constant tMAR2 to the cycle time that decreases with an increase in the clock frequency.

Figure 7:
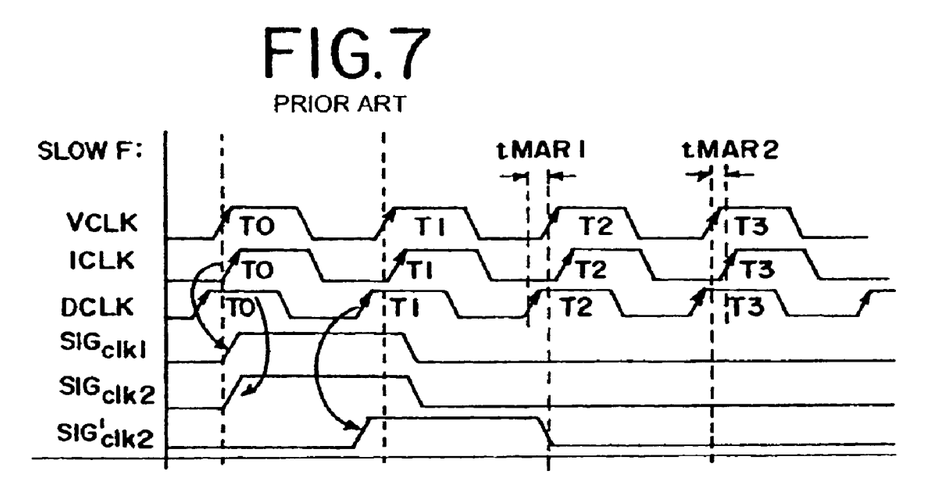
FIG. 7 shows a first timing diagram for a third embodiment of a known memory chip.
Figure 8:
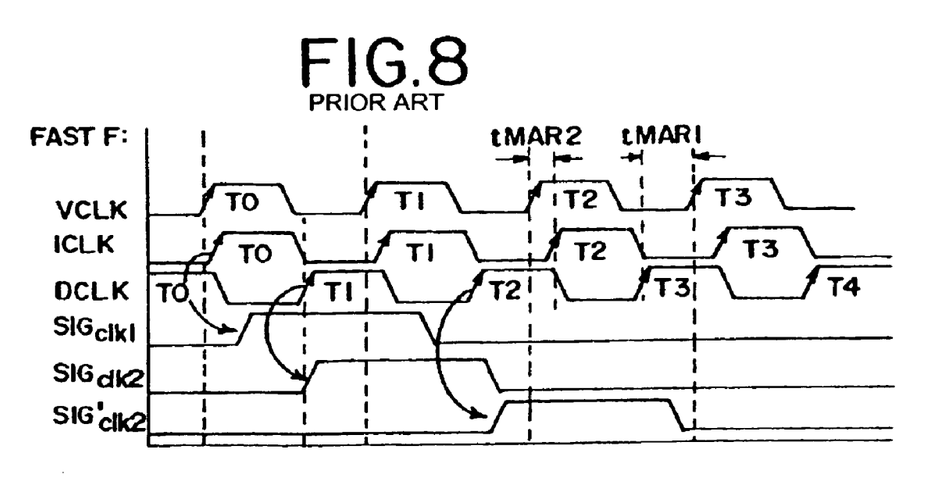
FIG. 8 shows a second timing diagram for the third embodiment of a known memory chip.

As shown in FIG. 7, a second internal clock signal DCLK is generated by a DLL of the DDR SDRAM. The internal clock signal DCLK and the system clock signal VCLK each have the same frequency. However, the internal clock signal DCLK is advanced with respect to the system clock signal VCLK by a constant amount tMAR1 that is dependent on the chip temperature, process variation and the operating frequency. The purpose of advancing the internal clock signal DCLK relative to the system clock signal VCLK is to time internal events within the DDR SDRAM so that they are edge aligned with the system clock signal VCLK when observed at the external DDR SDRAM pin.

As shown in FIG. 7, the signal $SIG_{clk1}$ is generated synchronous to the clock signal ICLK. Next, the signal $SIG_{clk1}$ is synchronized with and handled to the internal clock signal DCLK. As shown in FIG. 7, the signal $SIG_{clk2}$ shows the timing of the signal after latching (synchronizing) the signal $SIG_{clk1}$ to the internal clock signal DCLK domain. Signal $SIG'_{clk2}$ shows the signal $SIG_{clk2}$ after being shifted by one clock cycle DCLK.

As shown in FIG. 8, a different situation occurs when the system operates at a fast operating frequency, such as e.g. 200 MHz. In particular, while the internal clock signal ICLK still has the same frequency as the system clock signal VCLK, it lags the system clock signal VCLK by a constant amount tMAR2 that results in a greater phase delay when compared with the slow frequency case of FIG. 7. In addition, while the internal clock signal DCLK and the system clock signal VCLK each have the same frequency, the internal clock signal DCLK is advanced with respect to the system clock signal VCLK by a constant amount tMAR'1 that results in a greater phase delay when compared with the slow frequency case of FIG. 7. As shown in FIG. 8, the signal $SIG_{clk1}$ is generated synchronous to the clock signal ICLK. Similarly, this signal $SIG_{clk1}$ is synchronized and handled to the DCLK. $SIG_{clk2}$ shows the timing of the signal after latching (synchronizing) it to the DCLK domain. $SIG'_{clk2}$ shows the signal $SIG_{clk2}$ after shifting it by one clock cycle of DCLK. The end result is that the relative timing of the clock signals ICLK and DCLK is drastically different when compared with the slow frequency case.

With the above-described disparity in the relative timing it makes it very difficult to run commands within the DDR SDRAM in a consistent manner independent of the operating frequency of the system. For example, suppose that an output signal of the DDR SDRAM needs to be observed three VCLK cycles after the generation of the signal $SIG_{clk1}$. If the system was in the slow frequency mode, then the output signal would occur upon the DDR SDRAM chip counting the four DCLK pulses T0, T1, T2 and T3. In contrast, the output signal would occur after the chip counted only the three DCLK pulses T1, T2 and T3 in the fast frequency mode. Thus, the DDR SDRAM chip is unable to consistently run the output command based solely on the number of DCLK pulses counted. This limits the maximum operation frequency in which the DDR SDRAM can be operated within a DDR system. In addition, it limits the types of products run by the memory chip. In particular, a memory chip is able to run products that operate within a particular frequency range while the memory chip is unable to run other products that operate outside the particular frequency range.

BRIEF SUMMARY

One aspect of the present invention regards a memory system that includes a clock that controls one or more electrical components with an operating signal that is at an operating frequency and a memory chip connected to the clock, wherein the memory chip has a frequency detector for detecting at the least a range of values for the operating frequency.

A second aspect of the present invention regards a method of operating a memory system that includes generating an operating signal, controlling one or more electrical components with the operating signal and having a memory chip detect at the least a range of values for the operating frequency.

Each aspect of the present invention provides the advantage of simplifying control SDRAM control logic and therefore reducing die size.

Each aspect of the present invention provides the advantage of enabling high operation frequencies and thus increasing the SDRAM internal timing margin.

The present invention, together with attendant objects and advantages, will be best understood with reference to the detailed description below in connection with the attached drawings.

DETAILED DESCRIPTION OF THE DRAWINGS AND THE PRESENTLY PREFERRED EMBODIMENTS

Figure 9:
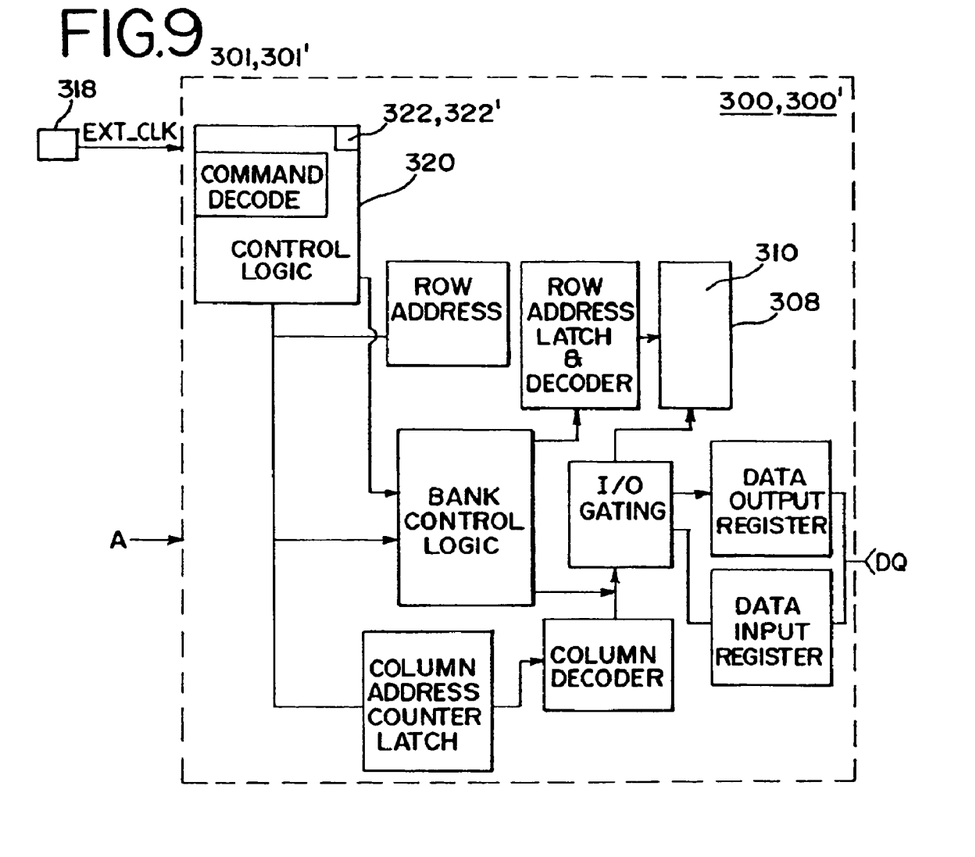
FIG. 9 shows a block diagram of two embodiments of a memory system in accordance with the present invention.

As shown in FIG. 9, a memory system 301 according to the present invention includes a DDR SDRAM chip 300 that has a structure similar to that of the DDR SDRAM chip described previously. In particular, the DDR SDRAM chip 300 includes a bank of memory arrays 308 that include memory storage cells 310 interconnected to one another via columns and rows of conductors in a manner similar to the memory arrays 208 and memory storage cells 210 discussed previously with respect to the SDRAM memory chip 200 of FIGS. 5 and 6. The memory chip 300 includes address input contact pins, differential clock pins to receive differential clock input signals and input/output pins DQ that receive and output signals in the same manner as their counterparts in the SDRAM chip 200 discussed previously. It should be noted that the present invention can be used with other types of memory chips that has to be synchronized between independent scaling clocking phases, such as DRAM, SDRAM, DDR SGRAM, DDR SDRAM and SRAM memory chips.

Figure 10:
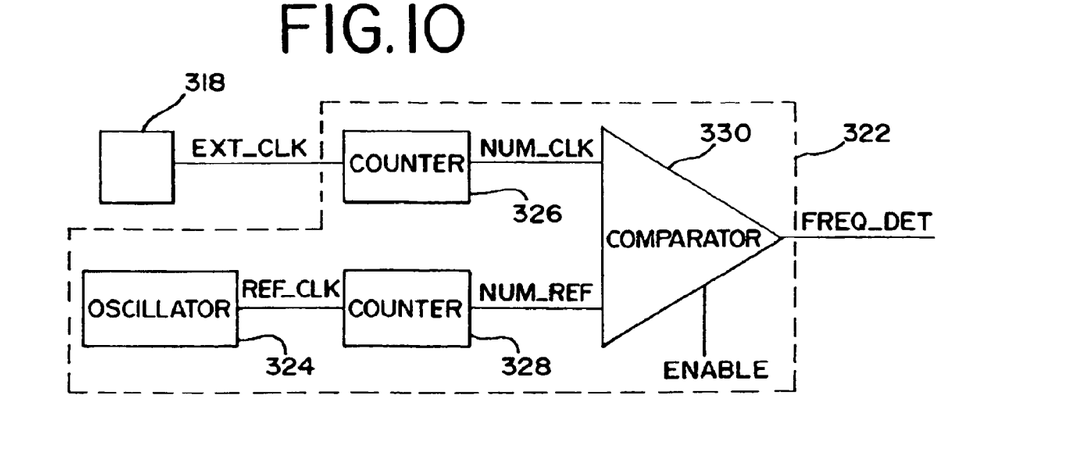
FIG. 10 schematically shows an embodiment of a frequency detector to be used with the memory system of FIG. 9.

As shown in FIG. 10, the frequency detector 322 has a reference frequency generator, such as an oscillator 324, that generates a reference clock signal REF_CLK. The reference clock signal REF_CLK has a reference frequency that is in between the maximum and minimum possible operation frequencies of the memory chip 300 and is chosen according to the individual chip requirements. For example, the reference frequency could be the threshold frequency of the memory chip 300. Upon selection of the reference frequency, operations performed by the memory chip 300 can be thought of as being performed in two distinct frequency regions—1) a first region with frequencies at or above the minimum frequency of the memory chip 300 and below the reference frequency and 2) a second region with frequencies at or above the reference frequency and at or below the maximum operation frequency of the memory chip 300. With this demarcation, the memory chip 300 performs an operation mode A within the first region and performs an operation mode B within the second region. For example, low frequency applications or low end products would be run by the memory chip 300 in operation mode A while high frequency applications or high end products would be run by the memory chip 300 in operation mode B.

An indirect frequency measurement technique is used to determine the external clock frequency since the time period that would be used to calculate the frequency is most likely not calibrated because it is measured from within the chip and can vary from chip to chip. This means the accuracy of a direct frequency measurement of the external clock frequency would not be very high. In the indirect technique, the clock signal EXT_CLK is directed to a counter 326 that counts the number of cycles of the clock signal EXT_CLK over a given amount of time. The count is output as the signal NUM_CLK. Similarly, the reference signal REF_CLK is directed to a second counter 328 that counts the number of cycles of the reference signal over a given amount of time. The count is output as the signal NUM_REF.

Figure 11:
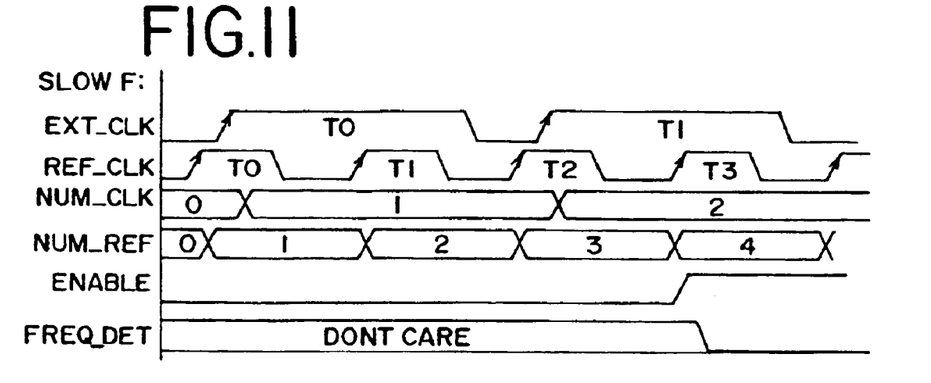
FIG. 11 shows a first timing diagram for the memory system of FIGS. 9 and 10.
Figure 12:
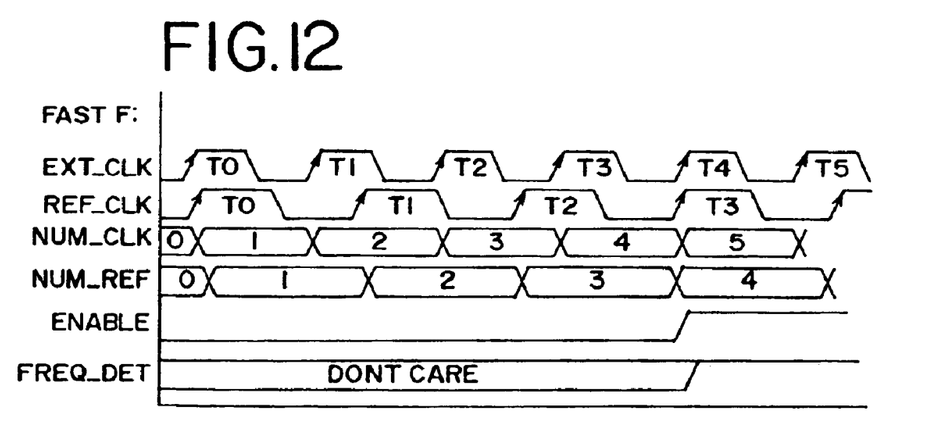
FIG. 12 shows a second timing diagram for the memory system of FIGS. 9 and 10.

The count output signals NUM_CLK and NUM_REF are directed to a comparator 330 of the frequency detector 322. As shown in FIGS. 11 and 12, after the given amount of time has passed and the signals NUM_CLK and NUM_REF are validated, an ENABLE signal is generated and sent to the comparator 330. Upon receipt of the ENABLE signal, the comparator 330 compares the values of the operating frequency and the reference frequency.

As an example, should comparator 330 determine that the external clock frequency is less than the reference frequency, then a FREQ_DET signal is output from the comparator 330 at a low state as shown in FIG. 11. The low state means that the clock frequency is within the first range of frequencies mentioned above. As shown in FIG. 12, should the comparator 330 determine that the external clock frequency is greater than the reference frequency, then the FREQ_DET signal is output as a high state and the clock frequency is within the second range of frequencies as mentioned above. In the case where the operation frequency and the reference frequency are equal, the comparator will assign either a stable high or a low output. Which state is chosen depends on the application purpose for which the frequency detection is chosen. In the example given above where operation mode B is used if the operation frequency is equal or higher than the reference frequency, the comparator will be assigned to a high state in the case of equilibrium between the operation and reference frequencies.

Figure 13:
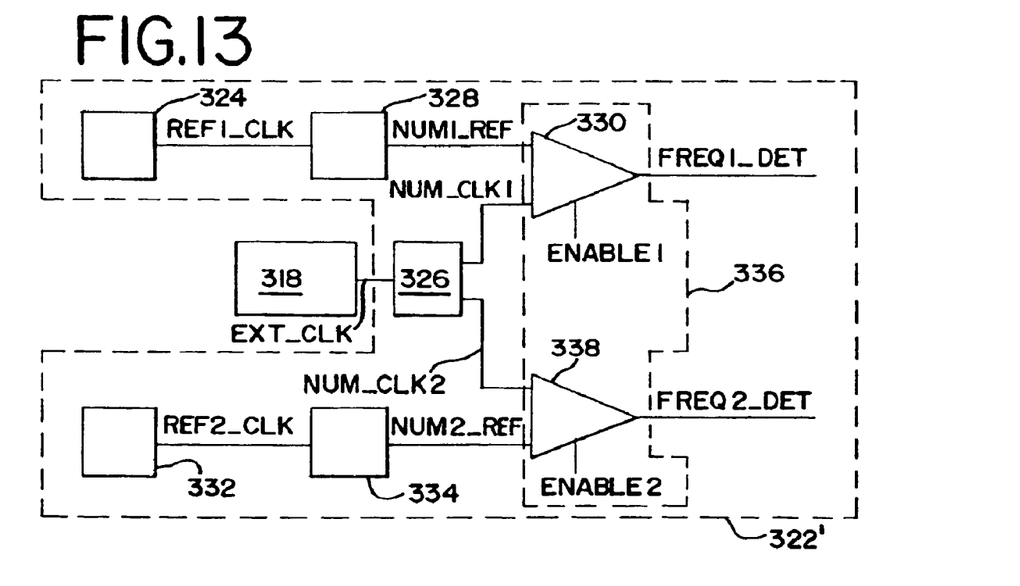
FIG. 13 schematically shows a second embodiment of a frequency detector to be used with the memory system of FIG. 9.

As shown in FIG. 9, a second embodiment of a memory system 301' is shown where the previously described memory system 301 has been altered so that a frequency detector 322' replaces the frequency detector 322 previously described. As shown in FIG. 13, the frequency detector 322' includes an additional reference frequency generator and comparator when compared with the frequency detector 322 of FIG. 10. The second frequency generator, such as an oscillator 332, generates a second reference clock signal REF2_CLK representative of a second reference frequency. The second reference frequency is chosen based on the particular application to be applied to the memory chip 300.

In this embodiment shown in FIG. 13, the clock signal EXT_CLK is directed to a counter 326 that counts the number of cycles of the clock signal EXT_CLK over a given amount of time. The count is output as the signal NUM_CLK. Similarly, the reference signals REF1_CLK and REF2_CLK are directed to corresponding counters 328 and 334 that count the number of cycles of the reference signals over a given amount of time. The counts are output as the signals NUM1_REF and NUM2_REF.

The count output signals NUM_CLK, NUM1_REF and NUM2_REF are then directed to a comparator system 336 of the frequency detector 322', after predetermined number of count output signals NUM_CLK1 have been generated, an ENABLE1 signal is sent to the comparator 330 which then compares each of the values of the two reference frequencies with the operating frequency in a manner similar to that described previously for the memory system 301 of FIGS. 9 and 10. In particular, count output signals NUM_CLK1 and NUM1_REF are directed to the comparator 330, which compares the operating frequency with the first reference frequency. Similarly, count output signals NUM_CLK2 and NUM2_REF are directed to the second comparator 338 after generating an ENABLE2 signal which compares the operating frequency with the second reference frequency.

As an example, let the first and second reference frequencies be designated as $\alpha$ and $\beta$, respectively, wherein $\omega_{min} \leq \alpha < \beta \leq \omega_{max}$, and wherein $\omega_{min}$ and $\omega_{max}$ are the minimum and maximum operation frequencies, respectively, of the memory chip 300. In this example, when the comparator 330 determines that the external clock frequency is greater than the first reference frequency, then a FREQ1_DET signal is output from the comparator 330 at a high state indicating that the clock frequency is within the range $\alpha \leq$ clock frequency $\leq \omega_{max}$. Should the comparator 330 determine that the clock frequency is less than the first reference frequency, then the FREQ1_DET signal is output as a low state indicating that the clock frequency is in the range $\omega_{min} \leq$ clock frequency $< \alpha$.

While the first reference frequency is compared, the second reference frequency is compared in a similar manner. In the same examples above, should the comparator 338 determine that the clock frequency is greater than the second reference frequency, then a FREQ2_DET signal is output from the comparator 338 at a high state indicating that the external clock frequency is within the range $\beta \leq$ clock frequency $\leq \omega_{max}$. Should the comparator determine that the clock frequency is less than the second reference frequency, then the FREQ2_DET signal is output as a low state then the clock frequency is in the range of $\omega_{min} \leq$ clock frequency $< \beta$.

The end result of the comparison of the two reference frequencies is that two ranges for the clock frequency are determined. Obviously, the clock frequency has a value that is within a range that is defined as the overlap of the two ranges determined. In the case when the comparators 330 and 338 determine that the clock frequency is above the first reference frequency and below the second reference frequency, then the clock frequency has a value that lies within the overlap of the ranges $\alpha \leq$ clock frequency $\leq \omega_{max}$ and $\omega_{min} \leq$ clock frequency $< \beta$. In other words, the clock frequency has a value that lies within the range $\alpha \leq$ clock frequency $< \beta$.

It should be pointed out that it is possible in the above example to determine the frequency exactly when the minimum end point of one range is exactly the same as the maximum end point of the other range. Needless to say this would be a rare event.

Comparing the two memory systems 301 and 301', the clocking frequency can be determined with more accuracy with the memory system 301' due to the use of an additional reference frequency generator. The clock frequency can be determined even more accurately by adding one or more additional reference frequency generators and corresponding comparators and counters so as to generate additional ranges of possible clocking frequency values. Again, the overlap of all of the detected ranges will result in determining where the clocking frequency lies.

Once the range of the clocking frequency is determined in the manner described above, the determined clocking frequency range can be used to improve the operation of the memory system. For example, the delay line length of a delay-locked-loop of a DDR SDRAM can be pre-adjusted based on the determined clocking frequency so as to decrease to the delay-locked-loop's locking time and possibly its power consumption. In addition, the frequency of a latency control logic of a memory chip can be adjusted based on the determined clocking frequency. That way different methods to determine the latency can be applied according to the current operating frequency which results in a wider possible frequency range the chip can operated in. The determined clocking frequency can also be used to indicate timing protocols for devices that are specified to run in different types of systems. That way different product specifications (e.g. high end/low end products) can be implemented in one chip. Thus saving development, production and logistic costs while increasing the portfolio. In addition, the determined clocking frequency can be stored on the memory chip and be used for choosing different computing modes, such as delaying the timing of an internal clock of the memory chip so as to correct the situation discussed previously with respect to FIGS. 7 and 8.

The foregoing description is provided to illustrate the invention, and is not to be construed as a limitation. Numerous additions, substitutions and other changes can be made to the invention without departing from its scope as set forth in the appended claims.

What is claim is:

1. A method of operating a memory system comprising a memory chip, the method comprising:

generating an operating signal at an operating frequency;

applying said operating signal to said memory chip for controlling one or more electrical components of said memory system with said operating signal;

generating a reference signal at a reference frequency within said memory chip; and detecting a range of values for said operating frequency on the basis of said reference signal and said operating signal.

2. The method of claim 1, wherein said memory chip is a DRAM memory chip.

3. The method of claim 1, wherein said memory chip is a SDRAM memory chip.

4. The method of claim 1, wherein said memory chip is a DDR SDRAM memory chip.

5. The method of claim 1, further comprising comparing the values of said operating frequency and said reference frequency.

6. The method of claim 1, further comprising:

counting a first number of cycles of said operating signal over a first given amount of time; and counting a second number of cycle of said reference signal over a second given amount of time.

7. The method of claim 1, further comprising generating a second reference signal at a second reference frequency.

8. The method of claim 7, further comprising comparing the value of said operating frequency with both said reference frequency and said second reference frequency.

9. The method of claim 8, further comprising:

determining a first range of values based on said comparing the value of said operating frequency with said reference frequency; and determining a second range of values based on said comparing the value of said operating frequency with said second reference frequency.

10. The method of claim 9, further comprising:

determining an overlap of said first and second range of values.

11. The method of claim 1, further comprising:

selecting a computing mode based on said detected range of values for said operating frequency.

12. The method of claim 11, wherein said selected computing mode comprises:

delaying the timing of an internal clock of said memory chip.

13. The method of claim 1, further comprising:

adjusting a delay line length of a delay-locked loop based on said detected range of values for said operating frequency.

14. The method of claim 1, further comprising:

adjusting a frequency of said at least one electrical component based on said detected range of values for said operating frequency.

15. The method of claim 14, wherein said at least one electrical component comprises a latency control logic.

16. The method of claim 14, further comprising:

indicating a timing protocol for said at least one electrical component based on said detected range of values of said operating frequency.

* * * * *